United States Patent

[11] 3,581,232

[72] Inventors Yoshimasa Murayama;
Hirokazu Kurono, both of Hachioji-shi, Japan

[21] Appl. No. 740,635
[22] Filed June 27, 1968
[45] Patented May 25, 1971
[73] Assignee Hitachi, Ltd.
Tokyo, Japan
[32] Priority July 14, 1967
[33] Japan
[31] 42/45061

[54] TUNABLE SEMICONDUCTOR BULK NEGATIVE RESISTANCE MICROWAVE OSCILLATOR
8 Claims, 8 Drawing Figs.

[52] U.S. Cl. 331/107, 317/234
[51] Int. Cl. H03b 7/14
[50] Field of Search 331/107 (G); 1/107; 317/234/10

[56] References Cited

UNITED STATES PATENTS

| | | | |
|---|---|---|---|
| 3,365,583 | 1/1968 | Gunn | 331/107(G)X |
| 3,414,841 | 12/1968 | Copeland | 331/107(G) |
| 3,336,535 | 8/1967 | Mosher | 331/107(G) |
| 3,466,563 | 9/1969 | Thim | 331/107(G)X |

OTHER REFERENCES

Copeland, " LSA Oscillator-Diode Theory" , Journal of Applied Physics, July 1967, pp. 3096— 3101. (331-107G)

Berson et al., " L-Band Epitaxial Gunn Oscillators" Proceedings of the IEEE, June 1967, pp. 1078. (331-107G)

Ishida, et al., " Current Oscillations and High Field Domains in Dark Conductive CdS Crystals" , Applied Physics Letters, May 1, 1966, pp. 235— 237. (331-107G)

Engelmann et al., " Oscillations in Bulk GaAs Due to an Equivalent Negative RF Conductance" , Proceedings of the IEEE, May 1966, pp. 786— 788. (331-107G)

Kroemer (1), " External Negative Conductance of a Semiconductor with Negative Differential Mobility" , Proceedings of the IEEE, September 1965, pp. 1246. (331-107G)

Kroemer (2), " Detailed Theory of the Negative Conductance of Bulk Negative Mobility Amplifiers, in the Limit of Zero Ion Density" , IEEE Transactions on Electron Devices, Sept. 1967, pp. 476— 490. (331-107G)

*Primary Examiner*—John Kominski
*Assistant Examiner*—Siegfried H. Grimm
*Attorney*—Craig, Antonelli, Stewart & Hill

ABSTRACT: A solid-state oscillator comprising a semiconductor element which has a bulk negative resistance and wherein injected excess carriers are present in operation, said device oscillating with a circuit frequency of a resonator as the space charge limiting current due to the injected carriers becomes unstable owing to the negative resistance.

INVENTORS
YOSHIMASA MURAYAMA
HIROKAZU KURONO

BY Craig & Antonelli
ATTORNEYS

INVENTORS
YOSHIMASA MURAYAMA
HIROKAZU KURONO
BY Craig & Antonelli
ATTORNEYS

TUNABLE SEMICONDUCTOR BULK NEGATIVE RESISTANCE MICROWAVE OSCILLATOR

The invention relates to a solid-state oscillator oscillating due to a bulk negative resistance and more particularly to an oscillator wherein the space charge limiting current due to the carriers injected from the electrodes into a semiconductor body is oscillated.

A Gunn oscillator is a known representative solid-state oscillator wherein oscillation takes place in a bulk semiconductor when a DC bias voltage is applied to the semiconductor. In such an oscillator, carriers undergo intervalley transition when a voltage above a threshold voltage is applied to a semiconductor crystal (e.g. N-type GaAs, N-type $GaP_xAs_{1-x}$ $0 \leq X \leq 1$, N-type InP, N-type CdTe) which includes a plurality of energy valleys of different effective mass in a conduction band. Thus, a negative resistance appears and the oscillator begins to oscillate.

In a Gunn oscillator, two modes of oscillation, are known, namely a Gunn mode oscillation, wherein a high field domain generated in the element due to the negative resistance is made to transit repeatedly and the oscillation frequency is fixed by the length of the element and the transit velocity and an LSA (Limited Space Charge Accumulation) mode, wherein a high frequency field swings above and below the threshold field so that the domains grow and decay repeatedly thereby preventing the progressive growth of the domains. Both of these two modes of oscillation originate in the domain which is formed by locally concentrating the carriers excited from the doped impurity in thermal equilibrium within the semiconductor element by the use of the negative resistance characteristic. Thus, as is well known a relation $\bar{n}l \gtrsim 10^{11}$cm.$^{12}$ must be fulfilled between the effective length 1 (cm.) of the element and the equilibrium carrier concentration $\bar{n}$ (cm.$^{13}$). When said relation is not satisfied, Gunn oscillation does not take place. The above relation clearly demands a large concentration $\bar{n}$ and/or length 1. When the concentration $\bar{n}$ is made large, the specific resistance of the element is decreased and it becomes difficult to apply an intense electric field. On the other hand, when the length 1 is made large, the frequency of the Gunn mode oscillation lowers, and in case of an LSA mode oscillation which intrinsically performs high field operation, an extremely high voltage must be applied. There is some technical difficulty in applying such a high voltage to a small region in a resonator containing the element and in this case it becomes necessary to connect a very large load resistance thereto.

Difficulties encountered when the concentration $\bar{n}$ and length 1 of a Gunn oscillator are treated independently have been described hereinabove. When the above difficulties are take into account, only such crystals whose concentration $\bar{n}$ corresponding to the quantity of doped impurity lies in a narrow range can be used to satisfy the relation presented hereinabove.

A primary object of this invention is to provide a solid-state oscillator whose oscillation frequency can easily be controlled by a resonator and which does not require any special eternal circuits.

Another object of this invention is to provide an oscillator wherein the space charge limiting current due to excess carriers injected into the element is oscillated, ad thereby to provide an oscillator having said features by using semiconductor materials which could not be used so far because of the quantity of doping impurity or the crystal structure.

A further object of the invention is to provide a compound oscillator capable of producing a large output wherein a plurality of oscillating elements can easily be joined in series.

A yet further object of this invention is to provide a solid-state oscillator simple in composition, easy to fabricate and having a rigid structure.

In summary, a solid-state oscillator according to this invention which achieves said objects comprises an element body having at least one semiconductor crystal wafer capable of exhibiting a bulk negative resistance under an applied electric field, the length of an active region thereof in the direction of said applied field being made small so that a large number of excess carriers far exceeding the number of inherent carriers contained in said active region are injected to stay in said region during operation; a pair of conducting layers joined in ohmic contact with the facing ends of said active region for injecting the carriers therefrom into said active region; electric means for applying a voltage sufficient to make said active region exhibit said bulk negative resistance characteristic to said active region through said conducting layers; and resonating means coupled with said element body for controlling a current flowing through said element body, whereby a space charge limiting current substantially consisting only of said injected excess carriers flows through said active region, and said current is perturbed by said bulk negative resistance and oscillates at a microwave resonance frequency of said resonating means.

Other objects, features and advantages of this invention as well as said objects will become more apparent from the following detailed description of some preferred embodiments of this invention when taken in conjunction with the accompanying drawings. In the drawings, the same parts are denoted by the same reference numerals.

FIGS. 1 and 2 are graphs showing the distribution of the carrier density and the field intensity just after a voltage is applied to the element and when the carriers are not yet energized sufficiently;

FIG. 3 is a graph showing a relation between the carrier velocity of a semiconductor material having a negative resistance characteristic and the intensity of an applied field;

FIG. 4 is a graph showing the distribution of the carrier density and the field intensity in a state where the carriers of the element become hot due to the applied field and a negative resistance begins to appear;

FIG. 5 is graph showing the change of an electric current running through the element with time;

Now, the principle of operation and features of this invention will be described in detail hereinbelow with reference to an embodiment employing an N-type GaAs crystal wafer.

In order to explain the behavior of excess electrons injected from the electrode into the GaAs crystal wafer, the following notations will be employed.

$\bar{n}$: density of electrons excited in thermal equilibrium from a donor to a conduction band (usually $n$ of the order of $10^{15}$ cm.$^{13}$ is employed), $e$: electric charge of an electron, $\bar{\mu}$: ohmic mobility of an electron, $\mu$: mobility of an electron which is a function of the field intensity, D: diffusion constant of an electron, $T_L$: lattice temperature of a crystal, $T_e$: electron temperature of hot electrons energized by the electric field, V: voltage applied to an element by a DC source, 1: effective length of an element in a direction of voltage application, $\bar{E}$: mean electric field V/1 in an element, $\epsilon$: static dielectric constant of a crystal, $E_{th}$: field intensity at which the mobility begins to decrease (nearly equal to a threshold field intensity of a conventional Gunn oscillator), $x$: space coordinate in a direction of voltage application wherein the end of the crystal connected to the negative electrode of the DC source is defined as $x$=0, $t$: time coordinate wherein the time of voltage application is chosen at $t$=0, $n(x, t)$, $E(x, t)$: electron density and field intensity in the element which are functions of $x$ and $t$.

Employing the above notation, the field intensity $E(x, t)$ and the current passing through the element $J(t)$ are expressed by the following formula, $$\frac{\partial}{\partial x}(\epsilon E) = 4\pi(n-\bar{n})e \qquad (1)$$

$$J(t) = ne\mu E - eD\frac{\partial n}{\partial x} + \frac{1}{4\pi}\frac{\partial}{\partial t}(\epsilon E) \qquad (2)$$

Accordingly, the behavior of the electric field and the current when a voltage is applied to an element is predicted by solving said two equations under given initial and boundary conditions. However, since it is not a simple matter to solve said equations mathematically under the conditions of this invention, in which only the injected excess carriers interact with the bulk negative resistance, and since the difference from the prior art should be made distinct, qualitative explanations will be given hereafter by dividing the whole process into three stages A, B, C.

Figure 1:
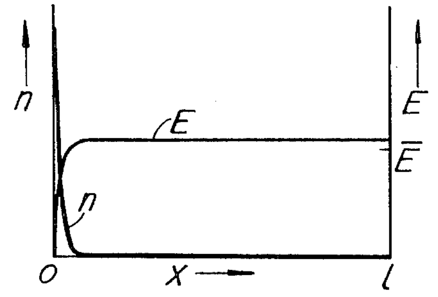
FIGS. 1 to 5 are graphs explaining the principle of operation of an embodiment of this invention.

A. Just after a step voltage is applied to an element, conduction electrons already present in the element begin to move in a positive direction due to the applied voltage. At the end of the cathode side of the element, electrons are injected concentrically from the electrode which is a conducting layer. Accordingly, an injected electron distribution a shown in FIG. 1 is formed in the element and thereby the field distribution as shown in the same figure is realized. In the figure, the abscissa denotes a distance $x$ between an arbitrary point in the element and the end of the cathode side and the ordinate designates an injected electron density $n(x)$ and a field intensity $E(x)$ in an arbitrary unit.

Figure 2:
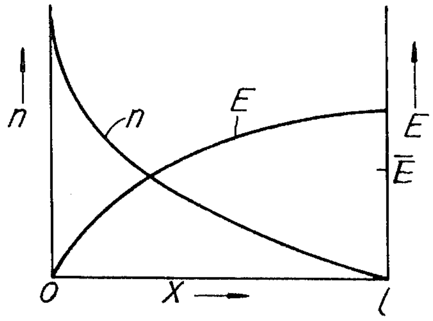

B. As time passes from the state (A), electrons are continuously injected from the electrode as before, but the injected electrons move in the element and an injected electron distribution different from that in state A is realized. However, in a time interval $t_1$ during which the energy of the injected electrons energized by the electric field is of the order of a lattice temperature of the element (i.e. $e\underline{\mu}E^2t_1 \simeq {}_L$, $t_1 \sim 10^{113}$ sec where $k$ denotes the Boltzmann constant), a space charge distribution and an electric field distribution as shown in FIG. 2 are realized in the element due to the continuous electron injection and the electron diffusion.

C. As time passes further and the injected electrons are energized sufficiently by the applied field, the injected electrons in an ordinary ohmic element exchange energy with the lattice and the electron density approaches a stationary distribution and the field intensity also approaches a stationary state. However, in an element according to this invention, in a time interval $t_2$ during which the injected electrons are energized hot by the applied field (i.e. $e\bar{\mu}E^2t_2 \sim kTe$, $t_2 \sim 10^{112}$ sec), the injected electrons, lying in an electric field region whose intensity exceeds a threshold value $E_{th}$, undergo intervalley transition of electrons as observed in the ordinary Gunn oscillation and the mobility thereof decreases.

Figure 3:
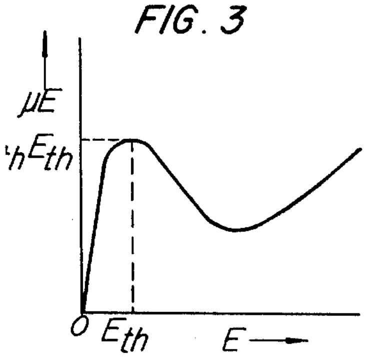

FIG. 3 shows a relation between the applied field and the electron velocity in a Gunn oscillator element. As is evident from the figure, the electron velocity $\mu E$ decreases as the field intensity increases in a field region over $E_{th}$ and the vale of $\mu E$ is smaller than the value of $\mu_{th}E_{th}$ and negative with respect to $\mu_{th}E$. Accordingly, in an element according to this invention, the electron velocity $\mu E$ is negative with respect to $\mu_{th}E_{th}$ in a region where an electric field whose intensity is greater than $E_{th}$ exists or in a region $x_{th}+\Delta x$ on the right of $x_{th}$ shown in FIG. 4. Since the diffusion constant of the electron $D$ is proportional to sad $\mu$ according to Einstein's formula, the solution of the equation (2) at $x+\Delta x$ is given by inverting the sign of time $t$ of the solution at $x-\Delta x$. Therefore, the injected electrons in a region $x+\Delta x$ behave in a time reversed way and the electron density distribution and the field distribution in this region approach the distributions as shown in FIG. 1.

Further, since the electron drift velocity is small at $x+\Delta x$ and large at $x-\Delta x$, electrons are accumulated in the injected vicinity of $x \cong x_{th}$. On account of said phenomena, the electron density distribution and the field distribution as shown in FIG.

Figure 4:
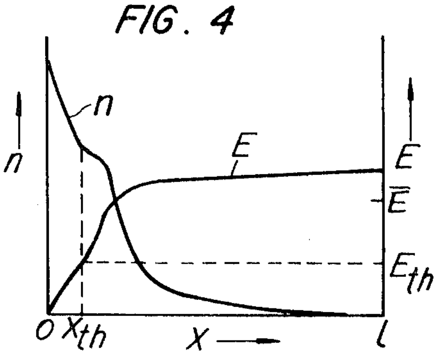

4 are realized. As far as $x_{th} << l$, the distribution shown in FIG. 4 is substantially equal to the distribution in FIG. 1 as seen from the figures. Thus, a large amount of electrons is injected again as in the stage just after the application of a voltage and said processes are repeated.

In summary, the presence of the injected excess electrons and the negative resistance characteristic of the element gives oscillatory perturbation to the transition to a stationary state. In the following consideration, said processes are replaced by the time variation of the space charge limiting current running through according element.

Figure 5:
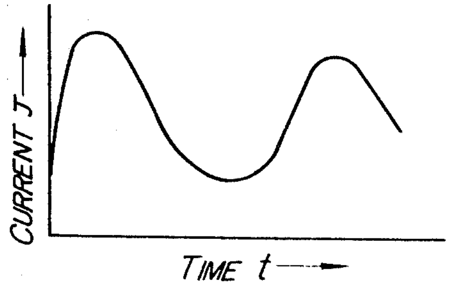

Referring to FIG. 5, the current increases rapidly due to the injected electrons just after the application o a voltage, reaches a maximum value and then decreases. In the case where the element has an ohmic property, the decreasing current approaches a stationary current. In an element accoridg to this invention which has a negative resistance, when injected electrons become hot as time passes, a distribution as shown in FIG. 4 appears and a large amount of electrons are injected again. Thus, a current increases and an oscillating current results.

Figure 6:
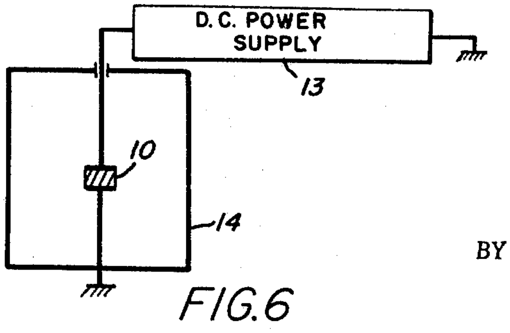
FIG. 6 is a sectional view showing an embodiment of the present invention.

The frequency of said oscillation is controlled by the circuit frequency of a resonator due to the interaction with a high frequency electric field in a cavity resonator on which the element is mounted. Referring to FIG. 6, there is shown an embodiment of the present invention. An element body 10 is disposed in a resonant cavity 14. DC power supply 13 is connected with the element body 10, so that a bias field is applied to the element body. During the operation, injected carriers in the element body 10 interact with a high frequency field having a frequency equal to the resonant frequency of cavity 14.

As has been fully described hereinabove, this invention is based on the principle that excess carriers are injected into a semiconductor element having a bulk negative resistance to make the space charge limiting current due to the injected carriers unstable by utilizing the negative resistance characteristic and thereby oscillation with a circuit frequency of an external resonator circuit results. In other words, the feature of the present invention resides in that the oscillation is effected only by the injected carriers, and that the injection is continuously controlled by the above-described specific action of the bulk negative resistance on the injected carrier distribution. Hence, the oscillation of the present invention due to the injected carriers differs entirely from those of the Gunn and LSA modes due to the carriers produced by the doped impurities.

Accordingly, in this invention, the current running through the element is mainly a space charge limiting current due to the injected carriers and in order to realize such a state, a large number of carriers more than the carriers present in thermal equilibrium with doped impurity must exist in the element during operation. Namely, conditions $$\bar{n}e \le \frac{\epsilon\bar{E}}{4\pi l}, \quad \bar{n}l \le \frac{\epsilon\bar{E}}{4\pi e}$$

must be fulfilled. When said conditions are not satisfied, since the number of the carriers in the element is substantially equal to the number of carriers existing in thermal equilibrium all the time, the local concentration of carriers caused by the negative resistance merely transits through the element and causes a Gunn mode oscillation. In this case, the oscillation frequency is not controlled by the external circuit.

If said embodiment is to be operated under $\bar{E}$ of 15 KV/cm., said relation becomes $\bar{n}l \le 10^{11}\,cm^{12}$ because $\epsilon \approx 10$ and it becomes necessary to use a GaAs crystal wafer of $n = 10^{15}\,cm^{13}$ and to make $l \le 10^{14}$ cm.

When $nl = 10^{10}\,cm^{12}$, the maximum current $J_{max}$ in operation becomes about 10 times the ohmic current $$J_{ohm}\left(\frac{J_{max.}}{J_{ohm}} \sim \frac{\epsilon\bar{E}/4\pi e}{\bar{n}l}\right.$$

ad the difference between the two becomes a maximum current amplitude. Thus, an oscillating current whose amplitude lies in said region appears.

It is to be noted that though the oscillation frequency can be controlled by the external resonator circuit as described hereinabove according to this invention, oscillation with a frequency higher than the dielectric relaxation time $\tau r=\epsilon 1\sigma$($\sigma$ is an ohmic electric conductivity of the (element) of the carriers injected into the element cannot be induced. As described above, the oscillation of the present invention is effected under the condition of $\bar{n}l$ $10^{11}$cm$^{12}$ in contrast with the Gunn and LSA oscillations which are effected under the condition of $\bar{N}L$ $10^{11}$. Further, the oscillation frequency of the present invention is limited only by the dielectric relaxation time of the injected carriers in contrast with the Gunn mode having a fixed frequency and the LSA mode having a limited frequency range such as $2\times10^4<\bar{n}/f<2\times10^5$ sec cm.$^{13}$.

The principle of operation of this invention has been explained hereinabove with reference to an embodiment using an N-type GaAs crystal wafer in comparison with conventional device.

Now, two embodiments of this invention of a series construction which particularly manifest the features of this invention will be described.

Figure 7:
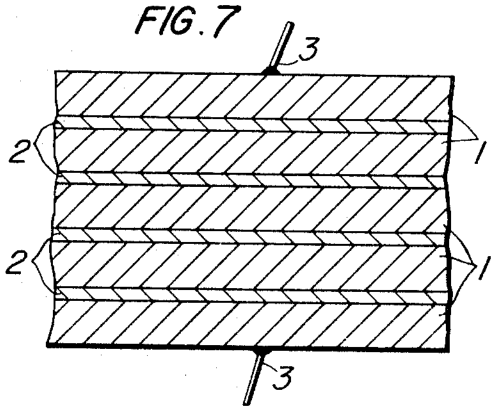
FIGS. 7 and 8 are sectional diagrams of mutually different element bodies used in the embodiments of this invention.

FIG. 7 shows a sectional diagram of an element wherein a plurality of conducting layers and semiconductor layers are laminated alternatively. In the figure, 1 denotes metal layers and a pair of lead wires 3 are connected to the metal layers at the ends f the element. Reference numeral 2 designates N-type GaAs layers and the junction parts between the metal layers 1 and the GaAs layers 2 are subjected to ohmic junction treatment. When a suitable external DC source (not shown in the figure) is connected to said element by way of the lead wires 3, electrons are injected at the junction parts between the GaAs layers and the metal layers nearer to the cathode of the source, an unstable space charge limiting current runs through the respective GaAs layers and there occurs oscillation with a circuit frequency of a cavity resonator on which the element is mounted. Thus, a large high frequency output can be obtained with an element comprising a plurality of GaAs layer.

In order to drive an oscillator composed by connecting a plurality of conventional Gunn oscillators in series with the same source, special care must be taken in view of the operation mechanism thereof, but since oscillation occurs due to the electron injection at the ends of the respective GaAs layers in the case of said embodiment, a stable series operation become feasible.

It is easy to make a modified version of said embodiment, wherein two kinds of N-type GaAs layers different in specific resistance are grown alternatively by epitaxial techniques and the GaAs layers having a specific resistance much smaller than that of the GaAs layers 2 of the active regions are used as conducting layers 1. In said embodiments, the GaAs layers composing active regions are made thin enough for the injected excess carriers to exist in operation.

Figure 8:
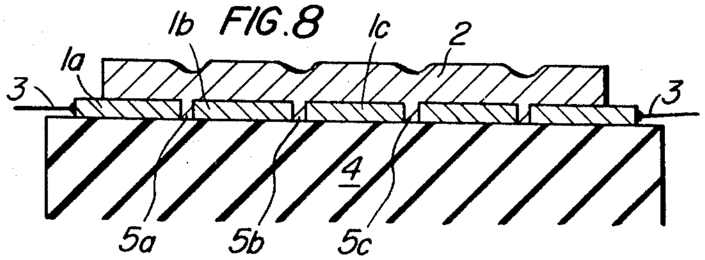

FIG. 8 shows a sectional diagram of another element wherein a plurality of conducting layers are provided in series on a substrate. In the figure, the metal layer 1 deposited on an insulating substrate 4 is divided into a plurality of metal layer wafers 1*a*, 1*b*, 1*c*... separated by parallel gaps 5*a*, 5*b*, 5*c*... eliminated by an electron beam or by photo resistance etching. The GaAs layer 2 is deposited on the metal layer wafers and in the gaps by vapor phase growth or the like. A pair of lead wires 3 are connected to the metal wafers on both ends. When a suitable external DC voltage is applied through the lead wires 3, substantially no current runs through the GaAs layer deposited on the metal wafers, but the GaAs layer filling the gaps becomes an active region and a current runs therethrough.

Thus, a series operation can be preferred as in the embodiment shown in FIG. 7. It is necessary in this case to make the width of the gaps narrow so that the injected excess carriers may compose a space charge limiting current according to this invention.

In the embodiments described hereinabove, a structure having a plurality of active regions are shown, but it is easy to fabricate an element comprising a single active region.

This invention has the advantage that an oscillator wherein the series connection is simple and which has a large output can be constructed as shown in said embodiments.

This invention has as further advantage that since the oscillation amplitude is usually proportional to the number of injected carriers, the carriers can be increased and the output can be increased by making *nl* small.

Further, as is evident from the foregoing explanation of the embodiments, this invention has the advantage that an oscillator easy to fabricate, simple in construction, rigid in structure and full of versatility can be provided.

In the foregoing description, embodiments of the invention wherein excess electrons are injected into an element having a negative resistance characteristic caused by the intervalley transition of electrons have been described. In addition, when excess carriers are injected into a crystal wherein a negative resistance is induced by the interaction of carriers with a lattice vibration, the space charge limiting current due to the injected carriers can be made unstable owing to the negative resistance characteristic of the element and thus oscillation can be induced.

In a crystal having a negative resistance caused by said interaction, the drift velocity is small and thus it was difficult to compose a high frequency transit type oscillator.

Since the influence of the carrier drift velocity in a crystal is substantially neglected according to this invention, a high frequency oscillation can be made to occur in such a crystal. For example, an oscillator capable of producing microwaves can be provided by the use of crystals like CdS, ZnO, GaSb, InSb. Thus, this invention is not restricted to crystals producing Gunn oscillation, but a tunable high frequency oscillator can be composed according to this invention by using a wide range of semiconductor crystals which exhibit a bulk negative resistance characteristic.

Though this invention has been described with particular reference to some specific embodiments of the invention, it will be evident for those skilled in the art that various changes and modifications can be made without departing from the spirit of the invention.

We claim:

1. A solid-state oscillator comprising an element body having at least one semiconductor crystal wafer capable of exhibiting a bulk negative resistance under an applied electric field, the length of an active region thereof in the direction of said applied field being made small so that a large number of excess carriers far exceeding the number of inherent carriers contained in said active region are injected to stay in said region during operation:

a pair of conducting layers joined in ohmic contact with the facing ends of said active region for injecting the carriers therefrom into said active region;

electric means for applying a voltage far exceeding a value which just makes said active region exhibit said bulk negative resistance characteristic to said active region through said conducting layer; and resonating means coupled with said resonant body for controlling a current flowing through said element body, whereby a space charge limiting current substantially consisting only of said injected excess carriers flows through said active region, said current is perturbed by said bulk negative resistance and oscillates at a microwave resonance frequency of said resonating means.

2. A solid-state oscillator according to claim 1, wherein said element body comprises one said crystal wafer and a pair of said conducting layers joined thereto and aid electric means is connected to said pair of conducting layers.

3. A solid-state oscillator according to claim 1, wherein said element body comprises a plurality of said crystal wafers and a plurality of said conducting layers joined alternatively therewith, said electric means is connected to the conducting layers on both ends of said element and said crystal wafers are connected in series thereby for operation.

4. A solid-state oscillator according to claim 1, wherein said element body comprises at least one said crystal wafer each of which comprises a plurality of active regions, said active regions are joined alternatively with a plurality of said conducting layers and said active regions are connected in series for operation.

5. A solid-state oscillator according to claim 1, wherein said crystal wafer is made of such a semiconductor material as exhibits a bulk negative resistance due to the intervalley transition of carriers energized by an applied electric field.

6. A solid-state oscillator according to claim 1, wherein said semiconductor material is selected from a group consisting of N-type GaAs, N-type $GaP_xAs_{1-x}$, N-type InP and N-type CdTe.

7. A solid-state oscillator according to claim 1, wherein said conducting layer is a metal layer.

8. A solid-state oscillator according to claim 1, wherein said conducting layer is a semiconductor layer of the same kind and of the same conductivity type as said crystal wafer and containing a large amount of doped impurity.